United States Patent [19]
Hirata

[11] Patent Number: 5,287,326
[45] Date of Patent: Feb. 15, 1994

[54] NON-VOLATILE SEMICONDUCTOR MEMORY DEVICE SELECTIVELY SKIPPING MEMORY CELLS IN PROGRAMMING

[75] Inventor: Masayoshi Hirata, Tokyo, Japan
[73] Assignee: NEC Corporation, Tokyo, Japan
[21] Appl. No.: 950,009
[22] Filed: Sep. 24, 1992
[30] Foreign Application Priority Data
 Sep. 27, 1991 [JP] Japan .................. 3-277192
[51] Int. Cl.⁵ .............................................. G11C 7/00
[52] U.S. Cl. .................. 365/230.03; 365/189.01; 365/189.07; 365/201
[58] Field of Search .................. 365/230.03, 230.08, 365/189.01, 201, 189.07, 200; 371/21.2

[56] References Cited
U.S. PATENT DOCUMENTS

| | | | |
|---|---|---|---|
| 4,763,305 | 8/1988 | Kuo | 365/200 |
| 4,811,294 | 3/1989 | Kobayashi et al. | 365/189.05 |
| 4,982,379 | 1/1991 | Miyata | 365/189.07 |
| 5,164,918 | 11/1992 | Ogino et al. | 365/201 |
| 5,172,338 | 12/1992 | Mehrotra et al. | 365/189.07 |

Primary Examiner—Eugene R. LaRoche
Assistant Examiner—Tan Nguyen
Attorney, Agent, or Firm—Sughrue, Mion, Zinn, Macpeak & Seas

[57] ABSTRACT

When an electrically erasable and programmable read only memory device enters a programming mode of operation, write-in data bits are sequentially compared with read-out data bits stored in the memory cells associated with the write-in data bits to see whether or not the write-in data bits are consistent with the read-out data bits, and the programming is carried out in case of inconsistence between the write-in data bits and the read-out data bits; however, if all of the write-in data bits are consistent with the read-out data bits, the write-in data bits are never written into the memory cells so that write-in/erasing characteristics are free from aged deterioration.

9 Claims, 5 Drawing Sheets

NON-VOLATILE SEMICONDUCTOR MEMORY DEVICE SELECTIVELY SKIPPING MEMORY CELLS IN PROGRAMMING

FIELD OF THE INVENTION

This invention relates to a non-volatile semiconductor memory device and, more particularly, to a programming technology for an electrically programmable read only memory device.

DESCRIPTION OF THE RELATED ART

A typical example of an electrically erasable and programmable read only memory device is illustrated in FIG. 1, and comprises a memory cell array 1. The memory cell array 1 is constituted by a plurality of memory cell sub-arrays 11 to 1z, and each memory cell sub-array 11 to 1z has a plurality of memory cells arranged in rows and columns. Floating gate type field effect transistors serve as the memory cells, respectively. A plurality of word lines W1 to Wx are shared between the memory cell sub-arrays 11 to 1z, and are coupled with the control gate electrodes of the associated rows of the floating gate type field effect transistors. A plurality sets of digit lines D1 to Dy are provided for the memory cell sub-arrays 11 to 1z, and a set of digit lines D1 to Dy are respectively coupled with the drain nodes of the associated columns of the memory cells. Though not shown in FIG. 1, a source line is shared between all of the floating gate type field effect transistors, and is coupled with a multiple voltage source (not shown). The memory cell array 1 thus arranged allows one of the memory cells in each memory cell sub-array to be identified with Dij where i and j are variable between 1 to x and between 1 to y, and a memory cell Dij in one of the memory cell sub-blocks 11 to 1z is identified with Dijk where k is indicative of the memory cell sub-bock 11, . . . or 1z. The floating gate type field effect transistor serving as each memory cell is variable in threshold level, and, accordingly, each memory cell stores a data bit the logic levels of which are corresponding to high and low threshold levels.

An address buffer unit 2 is coupled with address pins A1, A2, . . . and Ai, and an external address signal is temporarily stored in the address buffer unit 2. The address buffer unit 2 is coupled with a row address decoder unit 3 and with a column address decoder unit 4, and address predecoded signals AD1 and AD2 are respectively supplied to the row address decoder unit 3 and to the column address decoder unit 4. The row address decoder unit 3 and the column address decoder unit 4 select one of the word lines W1 to Wx and one of the digit lines D1 to Dy, and, accordingly, the memory cells Dij are addressable through the function of the row address decoder unit 3 and the function of the column address decoder unit 4. Latch circuits 5 are associated with the plurality sets of digit lines D1 to Dy, and are under the control of the column address decoder unit 4.

The memory cell sub-arrays 11 to 1z are coupled through data lines B1 to Bz with a sense amplifier unit 6, and the sense amplifier unit 6 quickly discriminates logic levels of data bits on the data lines B1 to Bz. The sense amplifier unit 6 in turn is coupled with an input/output data buffer unit 7 which in turn is coupled with input/output data pins DP1, DP2, . . . and DPz and with the latch circuits 5. Write-in data bits are supplied from the input/output data pins DP1 to DPz through the input/output data buffer unit 7 to the latch circuits, and temporarily stored in the latch circuits 5 for a set of digit lines Dj corresponding to one another in the memory cell sub-arrays 11 to 1z. On the other hands, read-out data bits take place on the data lines B1 to Bz in the form of voltage level, and the logic levels of the read-out data bits are quickly discriminated by the sense amplifier unit 6, then being supplied to the input/output data buffer unit 7 for producing output data signals at the input/output data pins DP1 to DPz.

The electrically erasable and programmable read only memory device selectively enters erasing mode, programming mode and read-out mode of operation. Fowler-Nordheim tunneling phenomenon takes place in the erasing mode of operation, and electrons are evacuated from the floating gate electrodes of all the memory cells to the source line. As a result, the threshold levels of all the memory cells are lowered below a critical level or a read-out voltage level, and conductive channels take place in the memory cells under application of the read-out voltage level to the control gate electrodes thereof. In the programming mode of operation, electrons are selectively injected into the floating gate electrodes, and the injected electrons causes the threshold levels to rise over the read-out voltage level, and no conductive channel takes place in the memory cells in the write-in state.

Thus, the prior art electrically erasable and programmable read only memory device changes the operation mode, and an external control signal MD indicative of the mode of operation instructs a control unit 8 to supervise the component circuits with various internal control signals. In order to program the memory cells, an extremely high write-in voltage level is selectively applied to the is provided for the memory cell sub-arrays 11 to 1z. The write-in circuit 9 is responsive to one of the internal control signals, and supplies the write-in voltage level through the column address decoder unit 4 and the latch circuits to the memory cell sub-arrays 11 to 1z.

In detail, the z-bit write-in data signal is supplied from the input/output data pins DP1 to DPz through the input/output data buffer unit 7 to the latch circuits 5, and is temporarily stored in the latch circuits 5 for a set of digit lines Dj selected by the column address decoder unit 4. The z-bits are respectively provided for the memory cells Dik of the respective memory cell sub-arrays 11 to 1z, and each of the z-bits is indicative of either erased or write-in state. If a write-in data bit is indicative of the erased state, the latch circuits 5 never apply the extremely high write-in voltage level to the associated digit line. However, if another write-in data bit is indicative of the write-in state, the latch circuits 5 transfer the extremely high write-in voltage level to the associated digit line. The row address decoder unit 3 lifts the word line Wi to an extremely high voltage level, and the word line Wi and the set of digit lines Dj selects the memory cells Dij from the respective memory cell sub-blocks 11 to 1z. Since the extremely high write-in voltage level is selectively applied to the set of the digit lines Dj, hot electrons are injected to the memory cells associated with the write-in data bits indicative of the write-in state only, and these memory cells enter the programmed stage. However, even if a memory cell has already entered the programmed state, the extremely high write-in voltage level is applied to the drain node of the memory cell in so far as the associated write-in data bit is indicative of the write-in state.

A problem is encountered in the prior art electrically erasable and programmable read only memory device in that the programming mode of operation consumes long time period, and the time period is prolonged by increasing the memory cell density. Another problem inherent in the prior art electrically erasable and programmable read only memory device is that the memory cells are liable to be damaged, and users suffer from aged deterioration of the programming characteristics.

SUMMARY OF THE INVENTION

It is therefore an important object of the present invention to provide a non-volatile semiconductor memory device which quickly completes a programming and is free from the aged deterioration.

To accomplish the object, the present invention proposes to strip memory cells already entered in a write-in state in a programming mode of operation.

In accordance with one aspect of the present invention, there is provided a non-volatile semiconductor memory device having an erasing mode, a programming mode and a read-out mode of operation, comprising: a) a memory cell array having a plurality of memory cells selectively entering erased state and write-in state for storing data bits, logic levels of each data bit being corresponding to the erased state and the write-in state, respectively; b) an addressing means operative to select at least one memory cell from the memory cell array for at least the programing mode and the read-out mode of operation; c) a read-out means operative to read out at least one data bit from the at least one memory cell; d) a controlling means storing at least one write-in data bit supplied from the outside thereof in the programming mode, and comparing the at least one write-in data bit with the at least one data bit to see whether or not the logic level of the at least one write-in data bit is inconsistent with the logic level of the at least one data bit, the controlling means being further operative to produce a prohibiting signal when the at least one write-in data bit is inconsistent with the at least one data bit, and e) a write-in means operative to write the at least one write-in data bit into the at least one memory cell in the absence of the prohibiting signal, the write-in means being prohibited from write-in of the at least one write-in data bit in the presence of the prohibiting signal.

In accordance with another aspect of the present invention, there is provided a non-volatile semiconductor memory device having an erasing mode, a programming mode and a read-out mode of operation, comprising: a) a plurality of memory cells respectively storing data bits, and divisible into a plurality of memory blocks, each of the plurality of memory cells selectively entering erased state and write-in state which correspond to logic levels of each data bit; b) an addressing means operative to sequentially selects memory cells of one of the plurality of memory blocks; c) a read-out means operative to sequentially read out data bits from the memory cells of the one of the plurality of memory blocks; d) a controlling means sequentially storing write-in data bit supplied from the outside thereof in the programming mode, and sequentially comparing the write-in data bits with the data bits of the aforesaid one of the plurality of memory blocks to see whether or not at least one of the write-in data bits are inconsistent in logic level with a corresponding data bit of the data bits read out from the memory cells, the controlling means being further operative to produce a prohibiting signal when at least one write-in data bit is inconsistent with a corresponding data bit of the data bits, and e) a write-in means operative to write the write-in data bits into the memory cells of the aforesaid one of the plurality of memory cell blocks in the absence of the prohibiting signal, the write-in means being prohibited from write-in of the write-in data bits to the aforesaid one of the memory blocks in the presence of the prohibiting signal.

BRIEF DESCRIPTION OF THE DRAWINGS

The feature and advantages of the non-volatile semiconductor memory device according to the present invention will be more clearly understood from the following description taken in conjunction with the accompanying drawings in which.

DESCRIPTION OF THE PREFERRED EMBODIMENTS

First Embodiment

Figure 1:
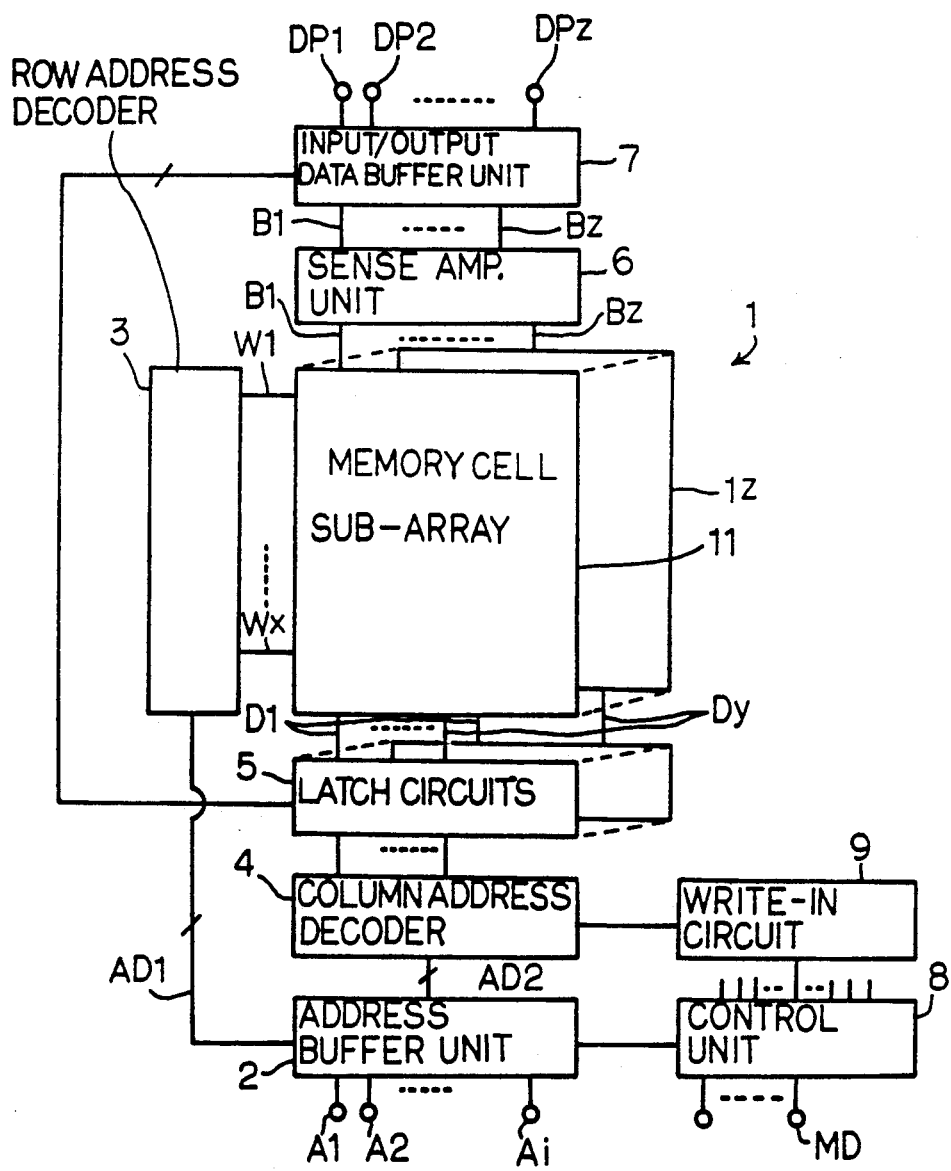
FIG. 1 is a block diagram showing the circuit arrangement of the prior art electrically erasable and programmable read only memory device.
Figure 2:
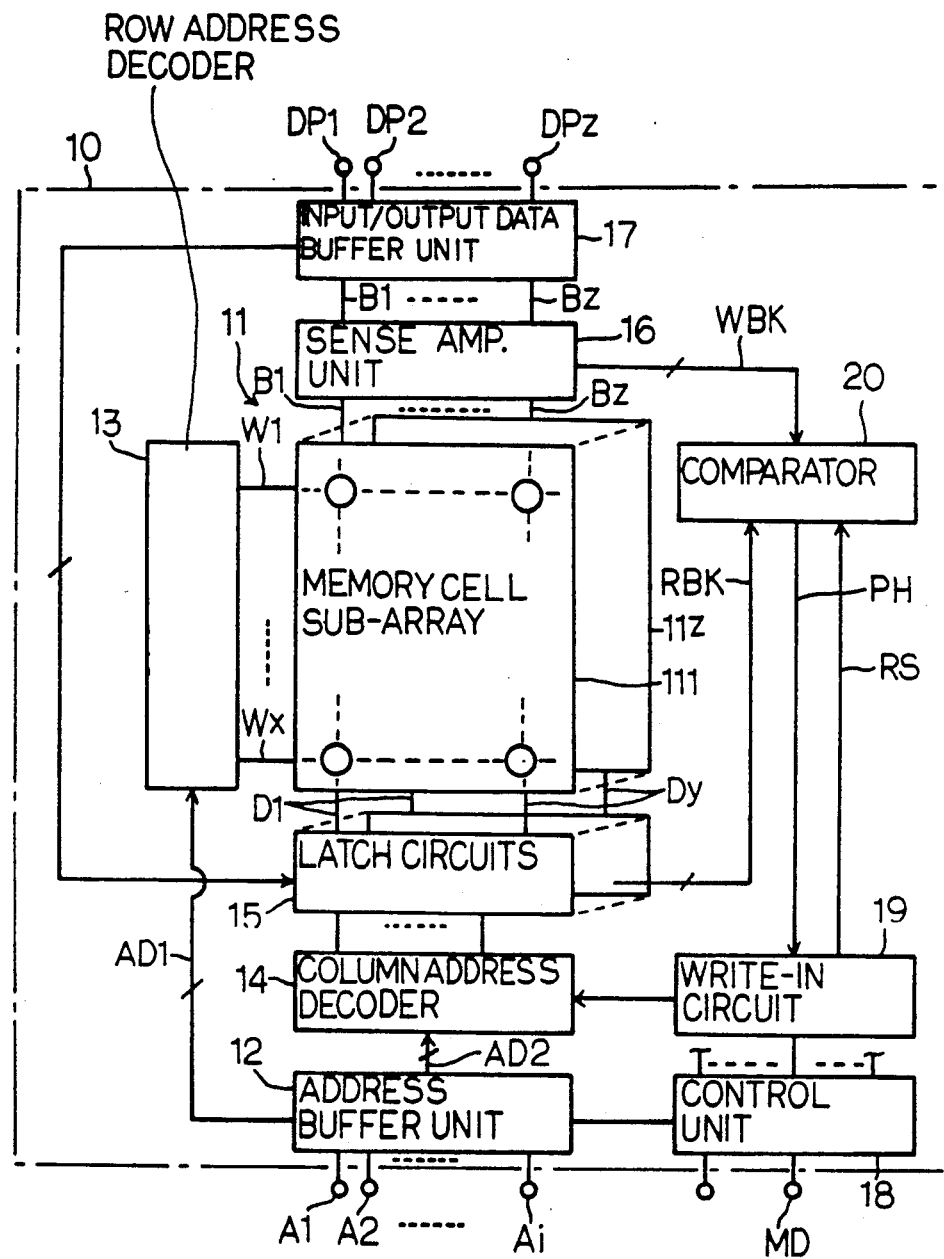
FIG. 2 is a block diagram showing the circuit arrangement of an electrically erasable and programmable read only memory device according to the present invention.

Referring to FIG. 2 of the drawings, an electrically erasable and programmable read only memory device embodying the present invention is fabricated on a single semiconductor chip 10, and comprises a memory cell array 11. The memory cell array 11 is constituted by a plurality of memory cell sub-arrays 111 to 11z, and each memory cell sub-array 111 to 11z has a plurality of memory cells arranged in rows and columns. Floating gate type field effect transistors serve as the memory cells, respectively, and only four memory cells of the memory cell sub-array 111 are represented by small circles in FIG. 2. However, the floating gate type field effect transistors are known to a person skilled in the art, and no further description is incorporated hereinbelow for the sake of simplicity.

A plurality of word lines W1 to Wx are shared between the memory cell sub-arrays 111 to 11z, and are coupled with the control gate electrodes of the associated rows of the floating gate type field effect transistors. A plurality sets of digit lines D1 to Dy are provided for the memory cell sub-arrays 111 to 11z, and a set of digit lines D1 to Dy are respectively coupled with the drain nodes of the associated columns of the memory cells. A source line (not shown) is shared between all of the floating gate type field effect transistors, and is coupled with a multiple voltage source (not shown). Corresponding memory cells of the respective memory cell sub-blocks 111 to 11z are represented by Dij, and one of the corresponding memory cells Dij is indicated by Dijk as similar to the prior art electrically erasable and programmable read only memory device.

An address buffer unit 12 is coupled with address pins A1, A2, ... and Ai, and an external address signal is temporarily stored in the address buffer unit 12. The address buffer unit 12 is coupled with a row address decoder unit 13 and with a column address decoder unit 14, and address predecoded signals AD1 and AD2 are respectively supplied to the row address decoder unit 13 and to the column address decoder unit 14. The row address decoder unit 13 and the column address decoder unit 14 select one of the word lines W1 to Wx and one of the digit lines D1 to Dy, and, accordingly, the memory cells Dij are addressable through the function of the row address decoder unit 13 and the function of the column address decoder unit 14. Latch circuits 15 are associated with the plurality sets of digit lines D1 to Dy, and are under the control of the column address decoder unit 14.

The memory cell sub-arrays 111 to 11z are coupled through data lines B1 to Bz with a sense amplifier unit 16, and the sense amplifier unit 16 quickly discriminates logic levels of data bits on the data lines B1 to Bz. The sense amplifier unit 16 in turn is coupled with an input-/output data buffer unit 17 which in turn is coupled with input/output data pins DP1, DP2, ... and DPz and with the latch circuits 15. Write-in data bits are supplied from the input/output data pins DP1 to DPz through the input/output data buffer unit 17 to the latch circuits 15, and temporarily stored in the latch circuits 15 for a set of digit lines Dj. The write-in data bits written into the memory cells Dij are hereinbelow referred to as "write-in data bits WBk", and the write-in data bit for the memory cell Dijk as "WB". On the other hands, read-out data bits take place on the data lines B1 to Bz in the form of voltage level, and the logic levels of the read-out data bits are quickly discriminated by the sense amplifier unit 16, then being transferred to the input-/output data buffer unit 17 for producing output data signals at the input/output data pins DP1 to DPz. The read-out data bits from the memory cells Dij are referred to as "read-out data bits RBk", and a read-out data bit for the memory cell Dijk as "read-out data bit RB".

The electrically erasable and programmable read only memory device according to the present invention also selectively enters erasing mode, programming mode and read-out mode of operation. However, the erasing mode and the read-out mode of the present invention are similar to those of the prior art electrically erasable and programmable read only memory device, and description is omitted for avoiding repetition.

In order to change the operation mode, an external control signal MD is supplied to a control unit 18, and instructs the control unit 18 to supervise the component circuits with various internal control signals.

While the electrically erasable and programmable read only memory device enters the programming mode of operation, an extremely high write-in voltage level is selectively applied to the drain nodes of the memory cells, and a write-in circuit 19 is provided for the memory cell sub-arrays 11 to 11z. The write-in circuit 19 is responsive to one of the internal control signals, and supplies the extremely high write-in voltage level through the column address decoder unit 14 and the latch circuits 15 to the memory cell sub-arrays 111 to 11z. The latch circuits 15 stores the write-in data bits WBk for a set of the digit lines Dj as described hereinbelow, and transfers the write-in data bits WBk to a comparator unit 20. The sense amplifier unit 16 further supplies the read-out data bits RBk to the comparator 20, and the comparator unit 20 sequentially compares the read-out data bits RBk with the write-in data bits WBk by changing the row address to see whether or not the read-out data bits are inconsistent with the write-in data bits. If at least one of the read-out data bits RB thus sequentially read out is inconsistent with the corresponding write-in data bit WB, the comparator 20 supplies a prohibiting signal PH to the write-in circuit 19 so as to skip the memory cells in the write-in operation. However, if no prohibiting signal PH is supplied to the write-in circuit 19, the extremely high write-in voltage level is selectively supplied to the drain nodes of the memory cells Dij, and the memory cells Dij specified by the write-in data bits WBk of logic "1" level enter the write-in state. The write-in circuit 19 reports the completion of the write-in operation with a reset signal RS, and the comparator unit 20 restarts the sequential comparison between the write-in data bits and the read-out data bits.

In this instance, the memory cells coupled with a set of the digital line Dj form in combination a memory block, and the address buffer unit 12, the row address decoder unit 13 and the column address decoder unit 14 as a whole constitute an addressing means. The combination of the input/output data buffer unit 17 and the write-in circuit 19 serves as a write-in means, and the sense amplifier unit 16 forms a read-out means together with the input/output data buffer unit 17. The latch circuits 15 and the comparator unit 20 forms in combination a controlling means.

Figure 3:
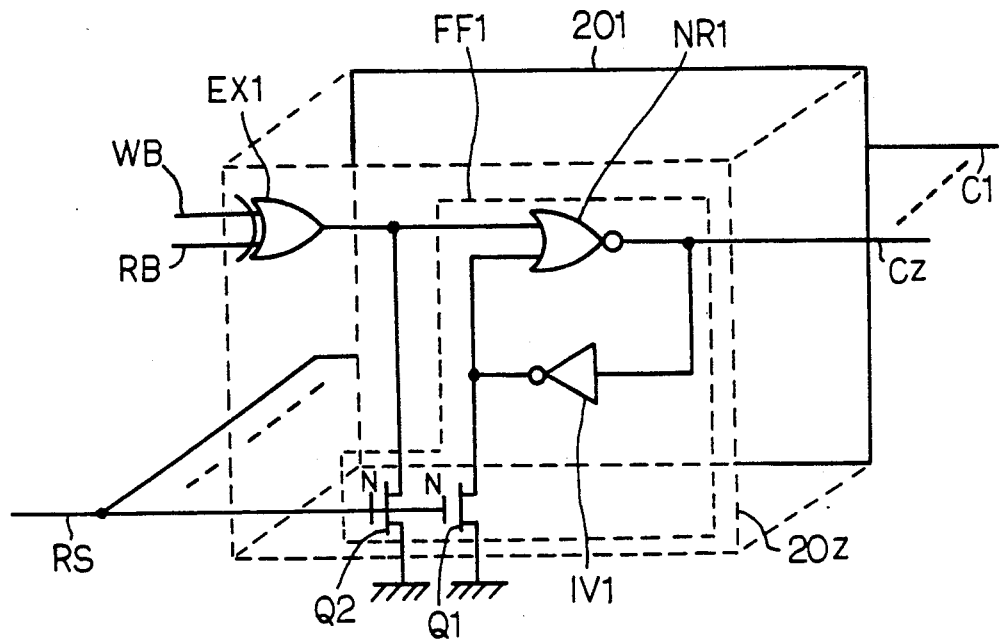
FIG. 3 is a circuit diagram showing the arrangement of a part of a comparator unit incorporated in the electrically erasable and programmable read only memory device shown in FIG. 2.

Turning to FIG. 3 of the drawings, a plurality of comparators 201 to 20z are incorporated in the comparator unit 20, and all of the comparators 201 to 20z are similar in circuit arrangement to one another. For this reason, description is made on the comparator 20z associated with the memory cell sub-array 11z only; however, the following description is applicable to the other comparators 201 to 20z-1. In the following description, logic "1" level and logic "0" level respectively correspond to high and low voltage levels.

The comparator 20z comprises an exclusive-OR gate EX1 supplied with the read-out data bit WB and the corresponding write-in data bit RB, and a bi-stable circuit FF1 reset with the reset signal RS of the high voltage level and set with the output signal of logic "1" level, and the bi-stable circuit FF1 comprises a NOR gate NR1, an inverter IV1 and two n-channel enhancement type reset transistors Q1 and Q2. While the exclusive-OR gate EX1 Yields the output signal of logic "0" level indicative of the consistency between the write-in data bit RB and the read-out data bit RB, the bi-stable circuit FF1 continues to produce the output signal Cs of logic "1" level. However, if the exclusive-OR gate EX1 finds inconsistency between the read-out data bit RB and the write-in data bit WB, the exclusive-OR gate EX1 produces the output signal of logic "1" level, and the output signal of logic "1" level sets the bi-stable circuit FF1 to logic "0" level. Once the bi-stable circuit FF1 is set to logic "0" level, the bi-stable circuit FF1 keeps the output signal Sz in logic "0" level regardless of the output signal of the exclusive-OR gate EX1 until the reset signal RS of the high voltage level is supplied thereto. Therefore, while the word lines W1 to Wx are sequentially driven to the read-out voltage level, the memory cells coupled with the selected digit line Dj sequentially supply read-out data bits RBi to the exclusive-OR gate EX1, and the read-out data bits RBi are sequentially compared with the write-in data bits WBi supplied from the latch circuits 15. Therefore, the output signal Cz of logic "0" level is indicative of inconsistency of at least one read-out data bit RB on the digit line Dj of the memory cell sub-array 11z inconsistent with the corresponding write-in data bit WB.

Figure 4:
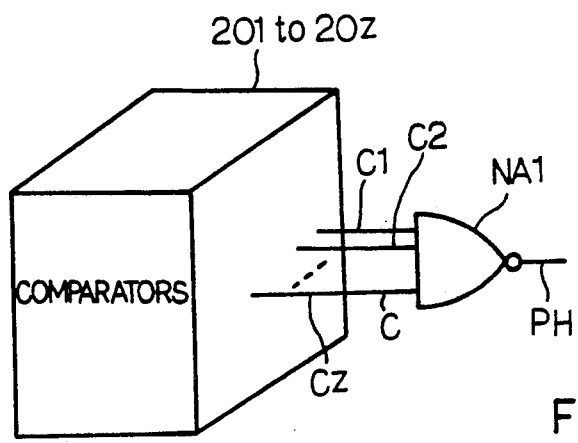
FIG. 4 is a circuit diagram showing the arrangement of another part of the comparator unit incorporated in the electrically erasable and programmable read only memory device.

As shown in FIG. 4, the comparators 201 to 20z supply the output signals C1 to Cz to a signal generator implemented by a NAND gate NA1 and the signal generator NA1 produces the prohibiting signal PH of logic "0" level indicative of inconsistency between at least one read-out data bit RB and the corresponding write-in data bit WB on a set of the digit lines Dj. Namely, if no inconsistency takes place, all of the output signals C1 to Cz are in logic "1" level, and the signal generator NA1 keeps the prohibiting signal PH in inactive logic "0" level, thereby prohibiting the memory cells on the set of digit lines Dj from the write-in data bits WBk. However, if one of the comparators 201 to 20z finds inconsistency, the output signal thereof is shifted to logic "0", and the prohibiting signal PH goes up to logic "1" level. Then, the write-in circuit 19 supplies the extremely high write-in voltage level through the column address decoder 14 to the latch circuits 15. The row address decoder 13 sequentially drives the word lines W1 to Wx, and the write-in data bits already stored allow the latch circuits 15 to selectively supply the extremely high write-in voltage level to the selected digit lines Dj. Then, the extremely high write-in voltage level is selectively applied to the drain nodes of the memory cells, and the control gate electrodes coupled with the sequentially selected word lines attract hot electrons for accumulating in the floating gate electrodes thereof. Then, the memory cells enter the write-in state, and the programming on the memory cells coupled with the set of digit lines is completed, and the reset signal RS is supplied to the comparators 201 to 20z for repeating the programming.

The function of each comparator 201, . . . or 20z is summarized in Table 1 where EX, IV and C are respectively indicative of the output of the exclusive-OR gate EX1, the output of the inverter IV1 and the output of the NOR gate NR1.

TABLE 1

|  | WB | RB | EX | IV | C |
|---|---|---|---|---|---|
| WB = RB | 0 | 0 | 0 | 0 | 1 |
|  |  |  |  | 1 | 0 |
| WB ≠ RB | 0 | 1 | 1 | — | — |
|  |  |  |  | 1 | 0 |
| WB ≠ RB | 1 | 0 | 1 | — | — |
|  |  |  |  | 1 | 0 |
| WB = RB | 1 | 1 | 0 | 0 | 1 |
|  |  |  |  | 1 | 0 |

Table 2 summarizes the relation between the function of the signal generator NA1 and the function of the write-in circuit 19 where PH is indicative of the logic level of the prohibiting signal PH.

TABLE 2

| C | PH | Instruction |
|---|---|---|
| C1 to Cz | 1 | Write data bits into cells |
|  | 0 | Don't write data bits into cells |

As will be understood from the foregoing description, if write-in data bits are consistent in logic level with the corresponding read-out data bits read out from the in data bits are discarded, and the memory cells are skipped in the programming mode of operation. As a result, the programming operation is completed in relatively short time period, and the thin gate insulating films of the floating gate type field effect transistors are hardly damaged through repetition of the programming. In other words, the programming characteristics are maintained over prolonged time period.

Second Embodiment

Figure 5:
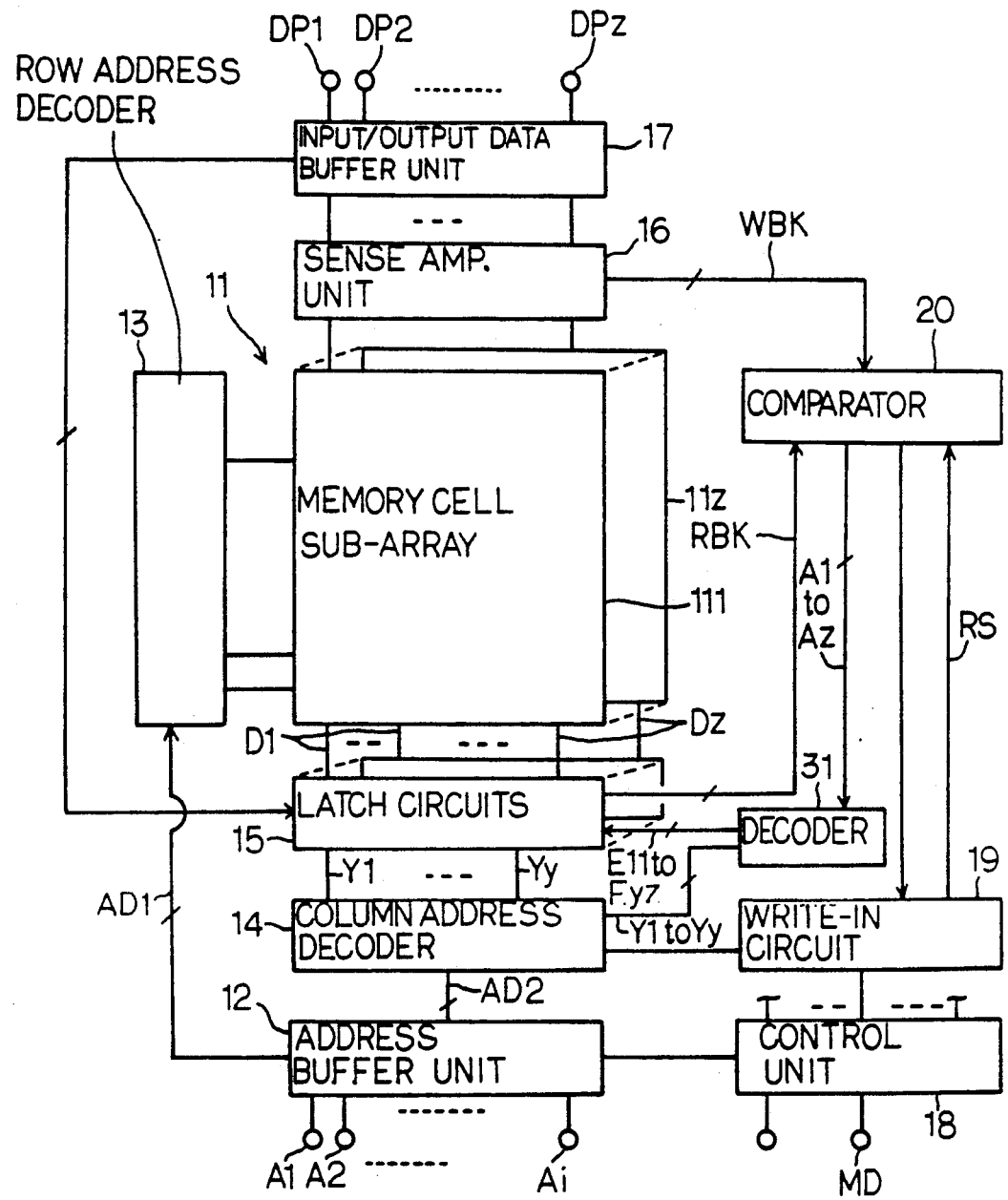
FIG. 5 is a block diagram showing the arrangement of another electrically erasable and programmable read only memory device according to the present invention.
Figure 6:
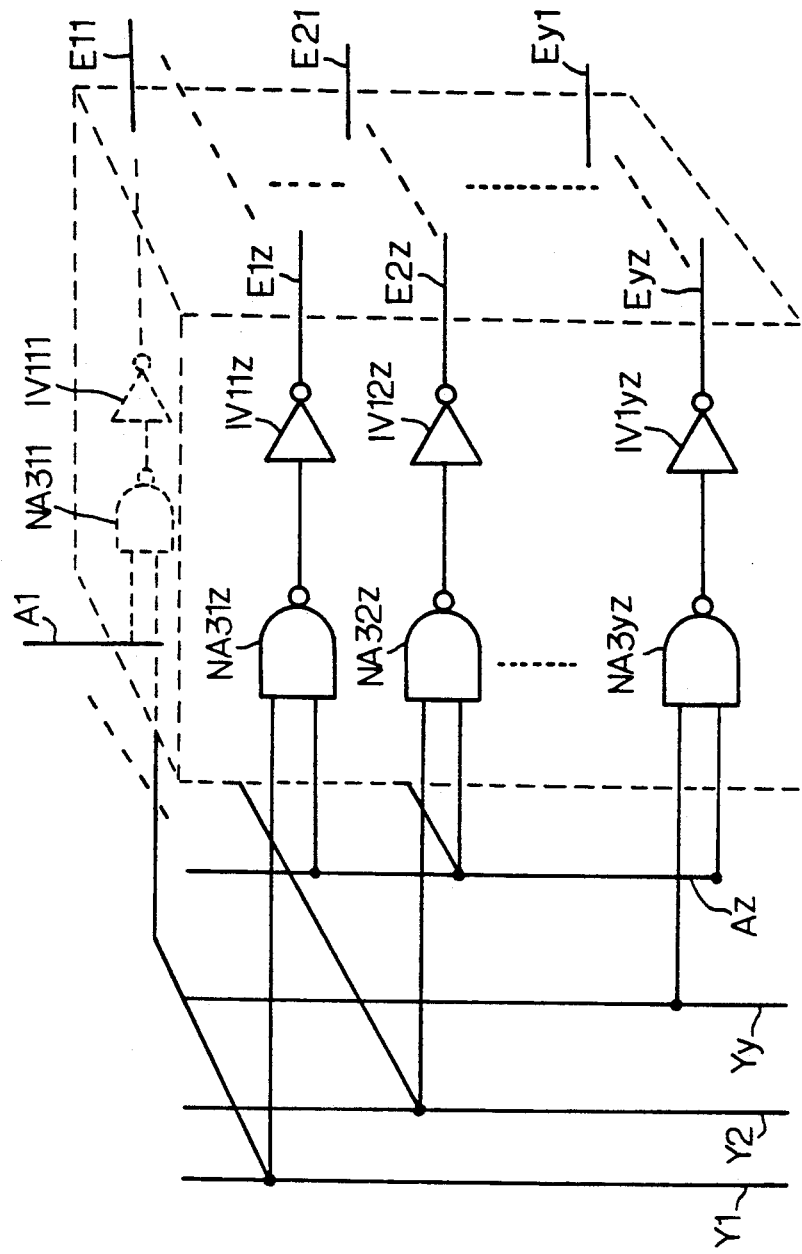
FIG. 6 is a circuit diagram showing the arrangement of a decoder circuit incorporated in the electrically erasable and programmable read only memory device shown in FIG. 5.

Turning to FIG. 5 of the drawings, another electrically erasable and programmable read only memory device embodying the present invention is illustrated. The electrically erasable and programmable read only memory device implementing the second embodiment is similar in circuit arrangement except for a decoder circuit 31, and, for this reason, the other component circuits and units of the second embodiment are labeled with the same references as the corresponding units of the first embodiment without any detailed description. The decoder circuit 31 comprises two-input NAND gates NA311 to NA3yz and inverters IV111 to IV1Zyz. However, only NAND gate NA311 and NA31z to NA3yz and the inverters IV111 and IV11z to IV1yz are shown in FIG. 6 for the sake of simplicity, and the NAND gates NA31z to NA3yz and the inverters IV11 to IV1yz are associated with the comparator 20z. The other NAND gates and the inverters are associated with the other comparators 201 to 20z-1 in a similar manner.

The decoded signals Y1 to Yy are supplied from the column address decoder unit 14 to the NAND gates NA311 to NA3yz, and the output signals A1 to Az of the exclusive-OR gates EX1 of the comparators 201 to 20z are supplied to the other input nodes of the NAND gates NA31 to NA3y. Since the NAND gates NA31z to NA3yz are associated with the comparator 20z, the output signal Az is supplied to the NAND gates NA31z to NA3yz, and the other output signals A1 to Az-1 are selectively supplied to the other NAND gates. The inverters IV111 to IV1yz supply latch signals E11 to Eyz to the latch circuits 15. When a latch signal is logic "0" level, the extremely high write-in voltage level is not supplied to the associated digit line regardless of the logic level of the write-in data bit. However, if the latch signal is logic "1" level, the latch circuit can supply the extremely high write-in voltage level to the associated digit line. Since the exclusive-OR gate EX1 shifts the output signal Az of logic "1" level in case of the consistency, the memory cells on the selected digit line Dj are not supplied with the extremely high write-in voltage level regardless of the logic level of the write-in data bits. Thus, the electrically erasable and programmable read only memory device implementing the second embodiment is prohibited from write-in operation using a byte as the unit of the prohibition. In this instance, memory sub-blocks are respectively implemented by the rows of the memory cells in each memory cell sub-array, and the output signals A1 to Az respectively serve as disable signals.

Although particular embodiments of the present invention have been shown and described, it will be obvious to those skilled in the art that various changes and modifications may be made without departing from the spirit and scope of the present invention. The present invention is applicable to an electrically programmable read only memory device erasable with ultra-violet light. Moreover, the non-volatile semiconductor memory device according to the present invention may form a part of an large scale integration. If a non-volatile semiconductor memory device is of the type writing only a bit in every write-in operation, each write-in data bit may be compared with the read-out data bit to see whether or not the write-in data bit is consistent with the read-out data bit.

What is claimed is:

1. A non-volatile semiconductor memory device having an erasing mode, a programming mode and a read-out mode of operation, comprising:
   a) a memory cell array having a plurality of memory cells selectively entering erased state and write-in state for storing data bits, logic levels of each data bit being corresponding to said erased state and said write-in state, respectively;
   b) an addressing means operative to select at least one memory cell from said memory cell array for at least said programming mode and said read-out mode of operation;
   c) a read-out means operative to read out at least one data bit from said at least one memory cell;
   d) a controlling means storing at least one write-in data bit supplied from the outside thereof in said programming mode, and comparing said at least one write-in data bit with said at least one data bit to see whether or not the logic level of said at least one write-in data bit is inconsistent with the logic level of said at least one data bit, said controlling means being further operative to produce a prohibiting signal when said at least one write-in data bit is inconsistent with said at least one data bit, and
   e) a write-in means operative to write said at least one write-in data bit into said at least one memory cell in the absence of said prohibiting signal, said write-in means being prohibited from write-in of said at least one write-in data bit in the presence of said prohibiting signal.

2. A non-volatile semiconductor memory device having an erasing mode, a programming mode and a read-out mode of operation, comprising:
   a) a plurality of memory cells respectively storing data bits, and divisible into a plurality of memory blocks, each of said plurality of memory cells selectively entering erased state and write-in state which correspond to logic levels of each data bit;
   b) an addressing means operative to sequentially selects memory cells of one of said plurality of memory blocks;
   c) a read-out means operative to sequentially read out data bits from said memory cells of said one of said plurality of memory blocks;
   d) a controlling means sequentially storing write-in data bit supplied from the outside thereof in said programming mode, and sequentially comparing said write-in data bits with said data bits of said one of said plurality of memory blocks to see whether or not at lest one of said write-in data bits are inconsistent in logic level with a corresponding data bit of said data bits read out from said memory cells, said controlling means being further operative to produce a prohibiting signal when at least one write-in data bit is inconsistent with a corresponding data bit of said data bits, and
   e) a write-in means operative to write said write-in data bits into said memory cells of said one of said plurality of memory cell blocks in the absence of said prohibiting signal, said write-in means being prohibited from write-in of said write-in data bits to said one of said memory blocks in the presence of said prohibiting signal.

3. A non-volatile semiconductor memory device as set forth in claim 2, in which said plurality of memory cells are implemented by floating gate type field effect transistors.

4. A non-volatile semiconductor memory device as set forth in claim 2, in which said addressing means comprises b-1) an address buffer unit coupled with a plurality of address pins, and operative to produce address predecoded signals, b-2) a row address decoder unit responsive to one of the address predecoded signals, and selectively driving word lines associated with the rows of said plurality of memory cells, and b-3) a column address decoder unit responsive to the other of said address predecoded signals for selecting one of a plurality sets of digit lines, said plurality sets of digit lines being respectively associated with said memory blocks.

5. A non-volatile semiconductor memory device as set forth in claim 4, in which said controlling means comprises d-1) a latch means associated with said plurality sets of digit lines, and storing said write-in data bits for said one of said plurality sets of digit lines selected by said column address decoder unit, and d-2) a comparator means operative to sequentially comparing said write-in data bits with said data bits of said one of said plurality of memory blocks to see whether or not at least one of said write-in data bits is inconsistent in logic level with a corresponding data bit of said data bits read out from said memory cells, said comparator means being further operative to produce said prohibiting signal.

6. A non-volatile semiconductor memory device as set forth in claim 5, in which said comparator means comprises d-2-1) a plurality of comparators associated with said plurality of memory blocks, respectively, and each comparing one of said write-in data bits with one of said data bits to see whether or not said one of said write-in data bit is inconsistent with said one of said data bits for producing an output signal indicative of inconsistency therebetween, said output signal being canceled with said reset signal, d-2-2) a signal generator supplied with said output signal of each of said comparator for producing said prohibiting signal.

7. A non-volatile semiconductor memory device as set forth in claim 2, in which said read-out means comprises c-1) a sense amplifier unit respectively associated with said plurality of memory blocks, and c-2) an input/output data buffer unit coupled between said sense amplifier unit and a plurality of input/output data pins.

8. A non-volatile semiconductor memory device as set forth in claim 2, in which said write-in means comprises e-1) said input/output data buffer unit, and e-2) a write-in circuit for selectively supplying an extremely high write-in voltage level to said one of said plurality sets of digit lines.

9. A non-volatile semiconductor memory device as set forth in claim 2, in which each of said plurality of memory blocks is further divisible into a plurality of memory sub-blocks, and in which said controlling means comprises d-1) a latch means having a plurality of latch circuit groups respectively associated with said plurality sets of digit lines, and responsive to latch signals for selectively storing said write-in data bits for said one of said plurality sets of digit lines, said latch signals being produced in association with said plurality of memory sub-blocks, respectively, d-2) a plurality of comparators respectively associated with said memory blocks, and each operative to sequentially comparing write-in data bits for the associated memory block with data bits read out from the associated memory block to see whether or not at least one of said write-in data bits is inconsistent in logic level with a corresponding data bit of said data bits read out from said associated memory block, said comparators being further operative to produce disable signals when finding inconsistency, and d-3) a decoder means coupled between said comparator means and said latch means, and responsive to said disable signals for producing said latch signals.

* * * * *